United States Patent
Norrie et al.

(10) Patent No.: US 6,172,623 B1
(45) Date of Patent: Jan. 9, 2001

(54) EFFICIENT BIT SCAN MECHANISM

(75) Inventors: Christopher I. Norrie; Dzung X. Tran, both of San Jose, CA (US)

(73) Assignee: Rise Technology Company, Santa Clara, CA (US)

(*) Notice: Under 35 U.S.C. 154(b), the term of this patent shall be extended for 0 days.

(21) Appl. No.: 09/274,275

(22) Filed: Mar. 22, 1999

(51) Int. Cl.[7] ..................................................... H03M 7/00
(52) U.S. Cl. ........................... 341/59; 345/501; 712/300
(58) Field of Search ...................... 341/59, 58, 60; 380/37; 345/501; 712/300; 708/607

(56) References Cited

U.S. PATENT DOCUMENTS

| | | | |
|---|---|---|---|
| 5,177,482 * | 1/1993 | Cideciyan et al. ..................... | 341/59 |
| 5,335,332 | 8/1994 | Christopher, Jr. et al. . | |
| 5,778,074 * | 7/1998 | Garcken et al. ........................ | 380/37 |
| 6,100,905 * | 8/2000 | Sidwell ................................... | 345/501 |

OTHER PUBLICATIONS

Intel, *Intel Architecture Software Developer's Manual*, "Instruction Set Reference," vol. 2, Order No. 243191, (1997) pp. 3–25 to 3–28.

* cited by examiner

Primary Examiner—Brian Young
Assistant Examiner—John Nguyen
(74) *Attorney, Agent, or Firm*—Oblon, Spivak, McClelland, Maier & Neustadt, P.C.

(57) ABSTRACT

A novel method and apparatus is disclosed for locating the first most, or least, significant set bit in a bit-string. The present invention breaks down the bit-string into a plurality of shorter sub-strings so that boolean operations can be performed directly to the shorter sub-strings for determining the location of the most/least significant set bit. Furthermore, this method can be repeatedly used to reduce the length of the shorter sub-string after the most/least significant sub-string is located. Particularly, this method of repeatedly dividing the bit-string greatly increases the speed of locating the set bit.

22 Claims, 5 Drawing Sheets

EFFICIENT BIT SCAN MECHANISM

BACKGROUND OF THE INVENTION

The present invention relates in general to enhance efficiency in data processing systems, and in particular to enhance efficiency in performing data bits processing functions. Still more particularly, the present invention relates to a method and an apparatus of enhancing processing efficiency in a data processing system for locating the most, or least, significant bit in a bit string comprising plurality of data bits.

In some computer operations or instructions, the most or least significant set bit on a data word or an array is requested by either an assembly instruction or other component in a microprocessor system. A set bit is defined conventionally as a bit set to "1". For example, in some matrix calculations, leading zeros of a bit-string is preferably to be eliminated in order to conserve memory space. Therefore, the first most significant set bit is needed to be located in order to truncate all the leading zeros. In another example such as floating point processing, leading zeros are generally detected and eliminated. Therefore, a method of efficiently detecting the first most., or least, significant set bit of a group of data bits is desired.

In the Intel (TM) x86 instruction set, there is an instruction Bit Scan Forward ("B SF") for searching an operand for the least significant set bit ("1 " bit). According to the Intel (TM) x86 instruction set, if a least significant 1 bit is found, its bit index is stored in the destination location. The bit index is an unsigned offset from bit 0 of the source operand. If the contents source operand does not contain any set bit, the contents of the destination operand is undefined. For example, in a 32-bit bit-string, the destination operand will be 5 bits long (i.e. S4,S3,S2,S1,S0).

The following algorithm is used to illustrate the detailed operation of the BSF in a conventional processor:

```
IF SRC = 0                      * No set bit?
   THEN
       ZF <-- 1;                * Set zero bit
           DEST is undefined;   * Result undefined
   ELSE
       ZF <-- 0;                * Reset zero bit
       temp <-- 0;              * Initialize temp reg
       WHILE Bit(SRC, temp) = 0 * Bit set?
       DO
           temp <-- temp + 1;   * Increment temp
           DEST <-- temp;       * Update result
       OD;                      * Loop exit
FI;                             * Finish
```

As shown in the algorithm, the processor tests each bit at a time and then proceeds to the next bit if the condition is not met. As it can be instantly recognized, extensive time delay will occur if the first least significant set bit is in the higher bits range.

Another example is the Intel (TM) instruction BSR where the most significant set bit is detected. The algorithm is similar to the BSF as shown above, with the replacing of the least significant bit with the most significant bit. However, the same timing penalty will be incurred when the set bit is located in some undesirable positions.

Therefore, a more efficient method of locating the most or least significant set bit is desired.

SUMMARY OF THE INVENTION

It is therefore an object of the present invention to disclose a bit scan method and apparatus capable of locating the first most/least significant set bit in a bit-string.

It is another object of the present invention to disclose a bit scan mechanism capable of preforming the bit scan in a few clock cycles.

It is yet another object of the present invention to disclose a bit scan mechanism being able to scale to any number of data bits in the bit-string.

It is a further object of the present invention to disclose a bit scan mechanism using minimum number of components.

The present invention discloses a method and apparatus to locate the first most/least significant set bit in a bit-string by breaking down the bit-string into a plurality of shorter sub-strings. After dividing the bit-string into shorter sub-strings, boolean operations can be performed directly to the sub-strings for determining the location of the most, or least, significant set bit. Furthermore, this method can be repeatedly performed to reduce the length of the shorter sub-string when the most/least significant sub-string is located. This method of repeatedly dividing the bit-string greatly reduces the speed of locating the set bit.

These and other objects and features of the invention will be better understood by reference to the detailed description which follows taken together with the drawings in which like elements are referred to by like designations throughout the several views.

DETAILED DESCRIPTION OF THE DRAWINGS

Figure 1:
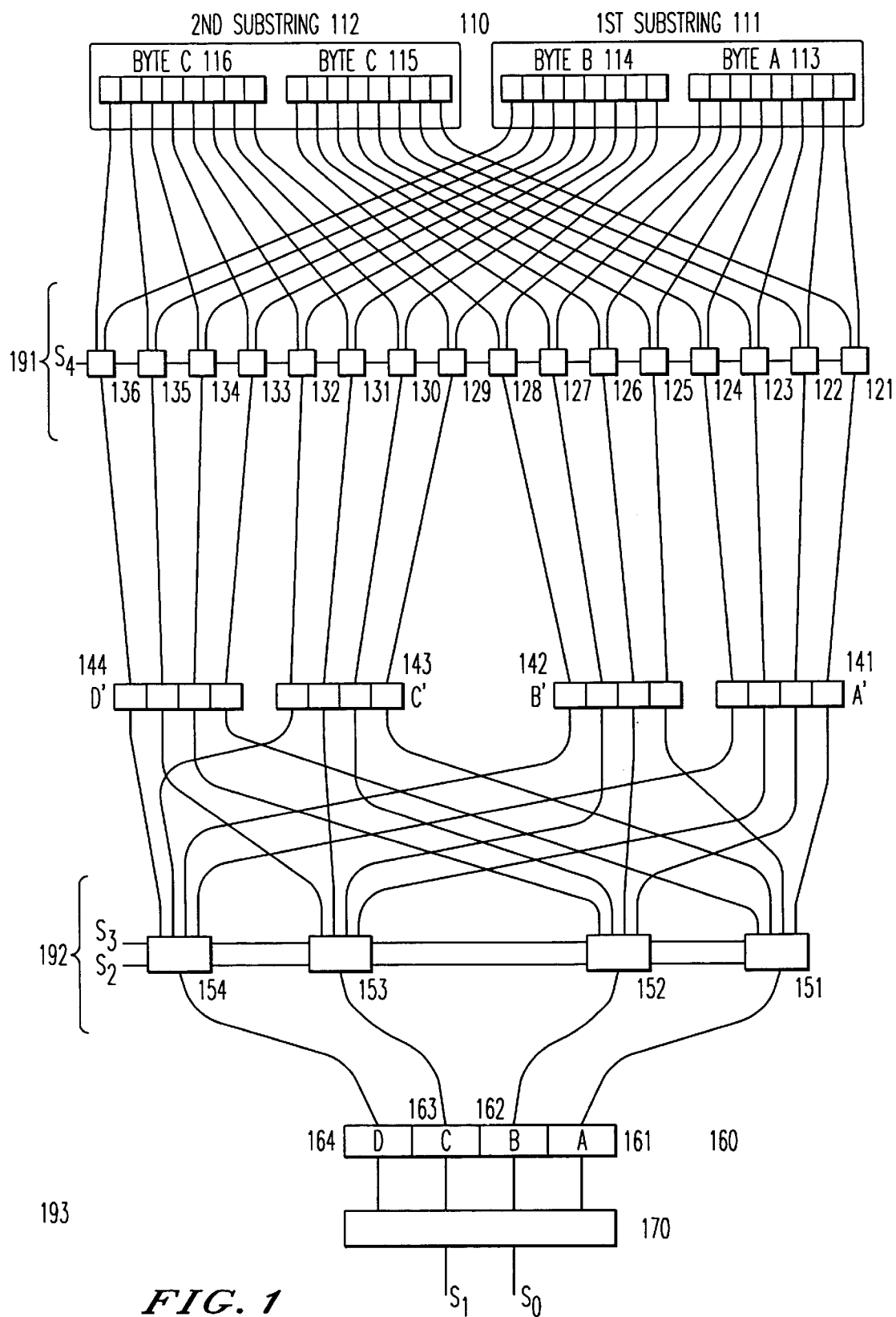
FIG. 1 shows a preferred embodiment of a bit scan mechanism according to the present invention.
Figure 2A:
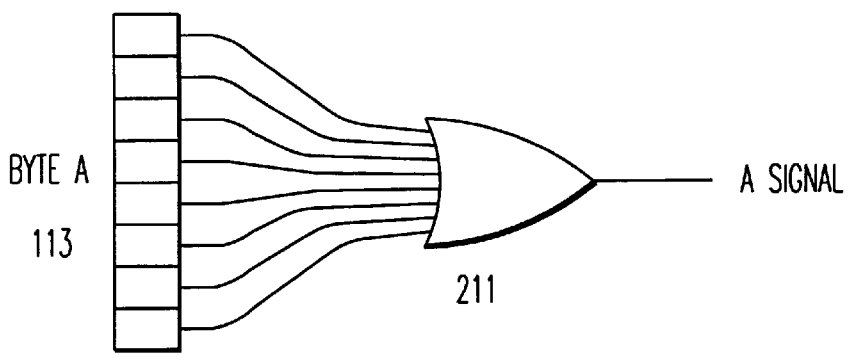
FIG. 2 shows a preferred embodiment of logic circuitry for generating A signal, B signal, C signal, and D signal according to the present invention.
Figure 2B:
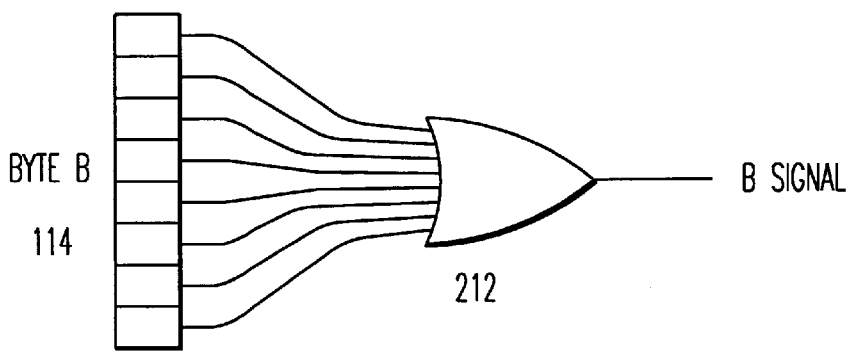
Figure 2C:
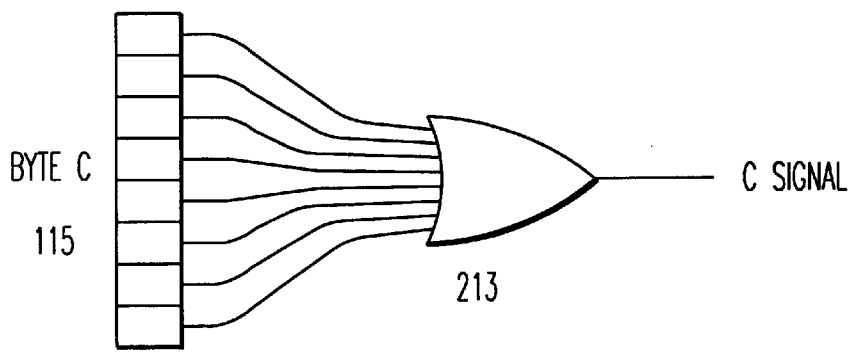
Figure 2D:
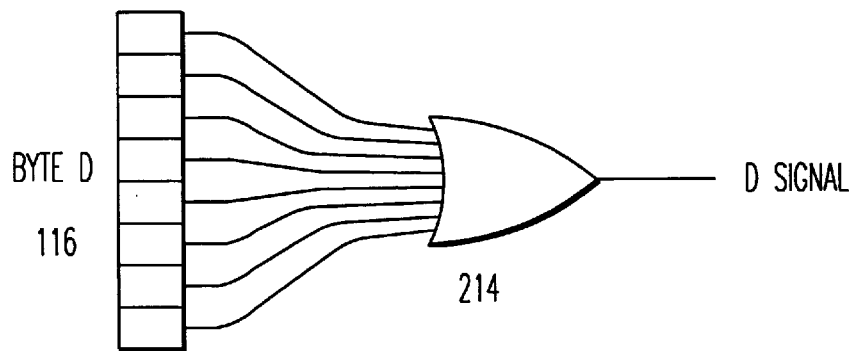
Figure 3A:
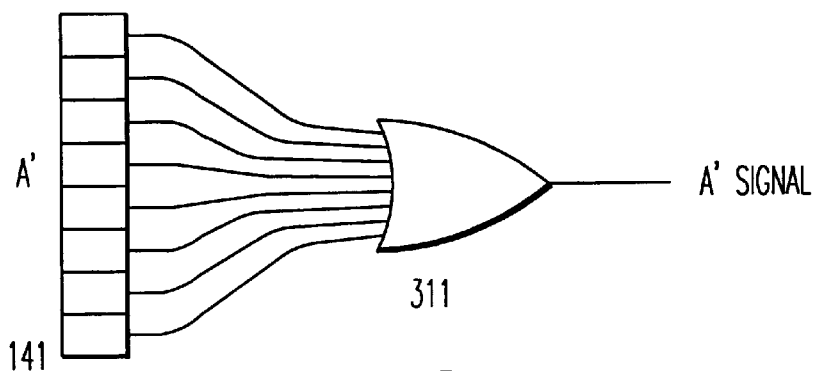
FIG. 3 shows a preferred embodiment of logic circuitry for generating A' signal, B' signal, C' signal, and D' signal according to the present invention.
Figure 3B:
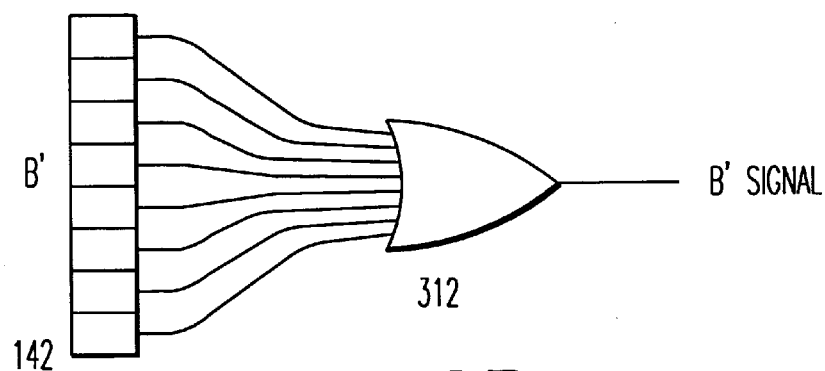
Figure 3C:
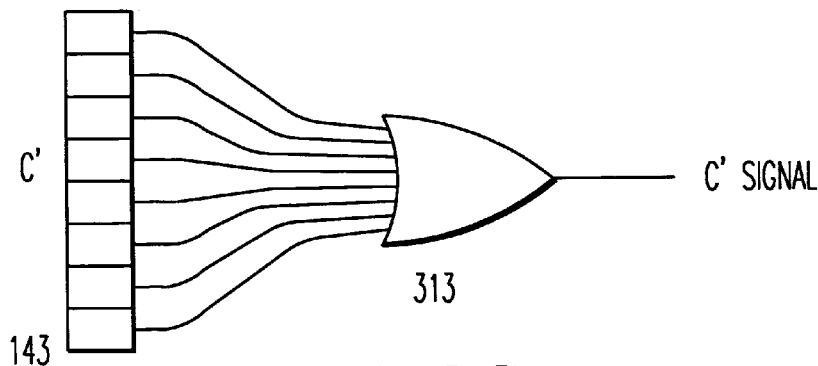
Figure 3D:
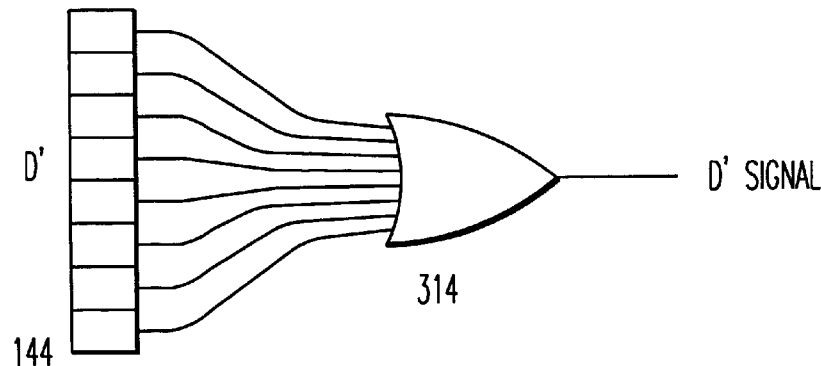

The present invention relates to a method and an apparatus of searching a bit-string for the least, or most, significant set bit (i.e. 1 bit).

The first aspect of the present invention relates to a method and an apparatus to handle the Intel x86 instructions for locating the most, or least significant set bit in a bit-string. In the Intel x86 architecture, two assembly instructions are defined to perform these functions. The first one is instruction BSF (i.e. Bit Scan Forward) that searches for the first least significant set bit in a bit-string. The second one is instruction BSR (i.e. Bit Scan Reverse) that searches for the first most significant set bit in a bit-string.

Depending on the length of the bit-string and the design complexity, the present invention performs a multi-level selection and elimination process to perform the set bit searching. In each level, each bit-string is divided into a plurality of sub-strings. Each of the sub-strings comprises a subset of data bits of the bit-string in that level. A determination is then made to determine which sub-string comprises the most, or least, significant set bit. Then, the sub-strings having the most, or least, significant bit is selected as the bit-string for the next level.

For example, an original bit-string comprises 32 bits, and is divided into four consecutive sub-strings A, B, C, and D.

Thus, each sub-string comprises 8 bits, where sub-string A comprises bits 0–7; sub-string B comprises bits 8–15; sub-string C comprises bits 16–23; and sub-string D comprises bits 24–31. Assuming the instruction is to locate the first most significant set bit. Then, sub-string D is checked to determine whether any of bits 24–31 contains a set bit. If sub-string D contains at least one set bit, sub-string D is then provided to the next level as the bit-string for analysis. If the sub-string D does not contain any set bit, then the similar determination can be performed on sub-string C, sub-string B, and sub-string A respectively. In other words, only the sub-string having the most significant set bit is selected for similar processing in the next level. Particularly, each level of the present invention reduces the length of the bit-string for processing in the next level. When the length of the resulting sub-string reaches a small number, Boolean logic operations can be performed to the data string to determine the exact location of the most, or least, significant set bit.

It should be noted that, in the preferred embodiment, the set bit determination for each sub-string can be performed simultaneously in order to avoid timing delays. In other words, each sub-string can be processed simultaneously to determine whether there is any set bit within. Boolean logic is then used to select the sub-string for the next level. This selection operation will be discussed in detail in the following paragraphs.

The bit scan apparatus and method described above can be divided into multiple levels, where each level performs a break down of the bit-string. Depending on the length of the original bit-string and design choices, different architecture can be implemented according to the present invention.

It should be noted that the present invention uses a recursive type method in locating the first most, or least, significant set bit. By using a recursive type method to break down the bit scan problem into smaller pieces, design complexity and computational time can be greatly reduced.

The following illustrates two preferred embodiment of the present invention showing different implementations according to the present invention.

In the first implementation as shown in FIGS. 1 to 3, a three-level process 191,192,193 is implemented. For illustration purposes, the following example is for determining the first most significant set bit of the bit-string. The embodiment of determining the first least significant set bit of the bit-string can be similarly implemented.

In the example as shown in FIG. 1, the input bit-string comprises 32 data bits. The bit-string 110 is broken down into two first intermediate sub-strings 111,112 each comprising 16 data bits. Specifically, the first sub-string 111 comprises the sixteen least significant bits 113,114, and the second sub-string 112 comprises the sixteen most significant bits 115,116. Then, boolean OR operations are performed on the data bits of each sub-strings 111,112 to determine whether the corresponding sub-string contains at least one set bit. After the boolean OR operations are performed, the sub-string containing the most significant set bit is identified. For example, if the second sub-string contains one set bit, the second sub-string is then chosen for the next iteration and the first sub-string can be eliminated. On the other hand, if the second sub-string does not contain any set bit, the first sub-string is then selected for the next iteration. The sixteen 2-to-i mutliplexers 121,122 . . . 136 as shown in the figure are used for selecting the 16-bit sub-string to be passed to the second level 192. As shown in the figure, each of the multiplexers 121,122 . . . 136 is provided with a select signal S4. Specifically, when S4 equals 1, the second sub-string 112 (i.e. bits 16–31) is selected as the bit-string for the next level On the other hand, when S4 equals 0, the first sub-string 111 (i.e. bits 0–15) is selected as the bit-string for the next level 192.

It should be noted the this select signal S4 and four other select signals S3, S2, S1, S0 grouped together form an index [S4,S3,S2,S1,S0] for indicating the exact position of the target bit (i.e. the most significant set bit) in the bit string. The generation of the four other select signals S3,S2,S1,S0 will be discussed in detail in the following paragraphs.

In the second level 192, the 16-bit sub-string selected and provided by the first level 191 is further divided into four second intermediate sub-strings 141,142,142,144 (A',B',C', D'). In this preferred embodiment, each of the four second intermediate sub-strings 141,142,143,144 comprises 4 data bits. Similar to the operations in the first level 191, each of the four intermediate sub-strings 141,142,143,144 is checked to determine whether the sub-string contains at least one set bit. Then, logic circuitry (not shown) is used to determine which of these four second intermediate sub-strings 141,142,143,144 comprises the most significant set bit.

In this second level 192, the boolean logic for determining which of the four second intermediate sub-strings 141,142, 143,144 comprises the most significant set bit used is similar to the first level 191. Specifically, all four bits of each intermediate sub-string is ORed together to check whether at least one bit is set in that particular sub-string. After all four ORed results are generated, the intermediate sub-string having the most significant set bit can be determined and selected. According to the present invention, four 4-to-1 multiplexers 151,152,153,154 are used in this level for selecting the intermediate sub-string having the most significant set bit for processing in the next level. As shown in the figure, each of these four mutliplexers 151,152,153,154 is controlled by two control signals S3,S2 to select the appropriate intermediate sub-string for the next level.

In the third and final level 192, since only 4 data bits 161,162,163,164 are left for checking, logic circuitry can be implemented to determine the exact position of the first most significant bit set in the original bit-string (i.e. 32-bit bit-string). As shown in the figure, two final control signals (i.e. S1,S0) are generated.

The following describes the detail operation of the generation of the five control signals S4,S3,S2,S1,S0 which form the 5 index bits for indicating the position of the most significant set bit of the original bit-string.

Specifically, in the first level 191 of the preferred embodiment as shown in FIG. 1, the original bit-string is broken into two intermediate sub-strings: first sub-string 111, second sub-string 112. The first sub-string 111 comprises 2 bytes (i.e. byte A 113, byte B 114), whereas the second sub-string 112 comprises 2 bytes (i.e. byte C 115, byte D 116). Then a summation bit is generated for each data byte (e.g. byte A 113, byte B 114, byte C 115, or byte D 116) by ORing every bit in the corresponding data byte. For example, as shown in FIG. 2, a D signal is generated by ORing all 8-bits of byte A 113. Similarly, as shown in FIG. 2, a C signal, a B signal, and a A signal are generated similarly by ORing every bit of the corresponding data byte. By ORing every bit of a data byte, the resulting ORed signal indicates whether any bit is set in that particular data byte. For example, when D signal is set, at least one of the 8 bits of the first data byte is set. Similarly, when C signal is set, at least one of the 8 bits of the second data byte is set.

After the four signals (i.e. A signal, B signal, C signal, and D signal) are generated, control signal S4 is generated as follows:

| S4 | D | C | B | A |
|----|---|---|---|---|
| 1  | 1 | x | x | x |
| 1  | 0 | 1 | x | x |
| 0  | 0 | 0 | 1 | x |
| 0  | 0 | 0 | 0 | 1 |

After solving the truth table, S4 = D + ~D C

As shown in FIG. 1, one of the two 16-bit intermediate sub-strings 111, 112 is selected for further processing in the level two 192. The selected sub-string is divided further into four second intermediate sub-strings (i.e. sub-string A' 141, sub-string B' 142, sub-string C' 143, and sub-string D' 144). Each of the four second intermediate sub-strings 141,142, 143, 144 comprises a 4-bit data. Similar to the first level 191, the present invention performs another operation on each of these four second intermediate sub-strings 141,142,143,144 to form four second intermediate signals: A' signal, B' signal, C' signal, and D' signal. FIG. 3 shows the generation of the four signals, A' signal, B' signal, C' signal, and D' signal. As shown in FIG. 3, each of the four signals is generated by a 4-input OR gate 311,312,313,314. Specifically, A' signal is generated by ORing all 4 bits of sub-string A' 141; B signal is generated by ORing all 4 bits of sub-string B' 142; C signal is generated by ORing all 4 bits of sub-string C' 143; and D signal is generated by ORing all 4 bits of sub-string D' 144. By ORing all bits of the second intermediate sub-string, the resulting ORed signal indicates whether any bit is set in that particular intermediate sub-string. For example, when D' signal is set, one of the four bits of sub-string D' 144 is set. Similarly, when C' signal is set, one of the 4 bits of sub-string C' 143 is set.

After the four intermediate signals (i.e. A' signal, B' signal, C' signal and D' signal) are generated, two control signals S3,S2 are generated accordingly. As described in the previous paragraphs, the four 4-to-1 multiplexers 151,152, 153,153 are controlled by these two control signals S3,S2 to select 4 data bits from one of the four intermediate bit-strings 141,142,143,144.

The two control signals S3,S2 are generated following the following truth table:

| S3 | S2 | D' | C' | B' | A' |
|----|----|----|----|----|----|
| 1  | 1  | 1  | x  | x  | x  |
| 1  | 0  | 0  | 1  | x  | x  |
| 0  | 1  | 0  | 0  | 1  | x  |
| 0  | 0  | 0  | 0  | 0  | 1  |

After simplifying the truth table, the following equations are generated:

$S3 = D' + \sim D'C'$ $S2 = D' + \sim D' \sim C'B'$

These two control signals S3, S2 are then provided to each of the four 4-to-1 multiplexers 151,152,153,154 for selecting the appropriate four bits from one of the four intermediate sub-strings 141,142,143,144. In this preferred embodiment, the outputs from these four 4-to-1 multiplexers 151,152,153,154 are then fed to a 4-bit register 160 (i.e. a,b,c,d), where the final two control bits S1,S0 are generated by logic circuit 170.

As described above, because the original data word is now reduced to a sub-string having a manageable number (i.e. 4) of data bits, logic operations can be applied to the resulting four bits to locate the exact location of the first most significant set bit in the original bit-string Particularly, in this preferred embodiment, the final two control signals S1,S0 are generated by the logic circuit 170 using the following truth table:

| S1 | S0 | d | c | b | a |
|----|----|---|---|---|---|
| 1  | 1  | 1 | x | x | x |
| 1  | 0  | 0 | 1 | x | x |
| 0  | 1  | 0 | 0 | 1 | x |
| 0  | 0  | 0 | 0 | 0 | 1 |

After simplifying the truth table, the following equations are generated:

$S1 = d + \sim dc$ $S0 = d + \sim d \sim cb$

Therefore, in combining with the above-calculated results, the exact position of the first most significant bit set is: S4,S3,S2,S1,S0, where the equations of each bit are as follows:

$S4 = D + \sim DC$ $S3 = D' + \sim D'C'$ $S2 = D' + \sim D' \sim C'B'$ $S1 = d + \sim dc$ $S0 = d + \sim d \sim cb$ It should be pointed out that the number of levels and the type of multiplexers used in each level are flexible to accommodate different needs and requirements of the circuit. When a manageable number of bits (in this case, 4 bits) in the sub-string is reached, logic circuitry can be used to determine the exact position of the most significant set bit. This method of breaking down a complicated problem into progressively smaller versions of the problem is conventionally called recursive.

Figure 4:
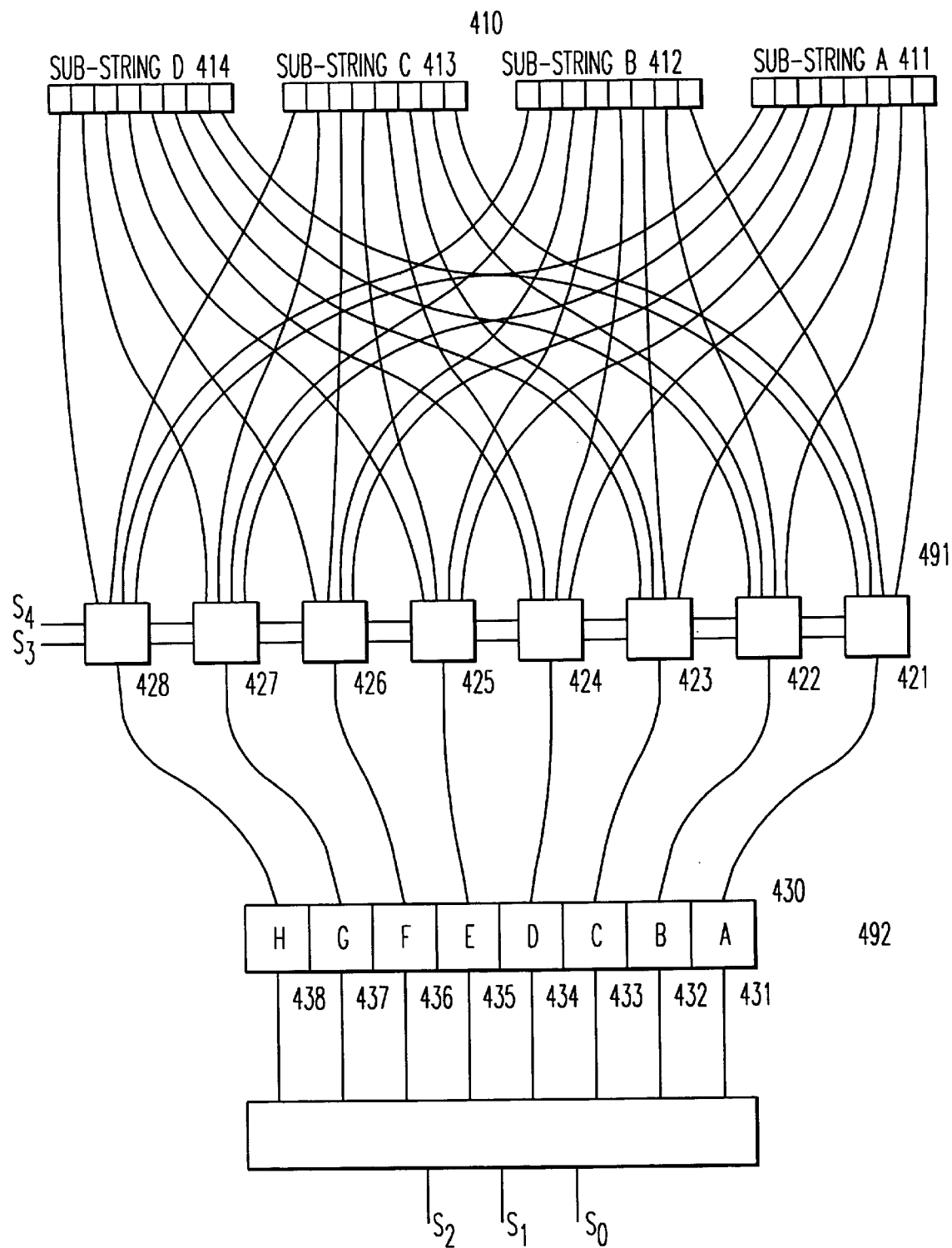
FIG. 4 shows another preferred embodiment of a bit scan mechanism according to the present invention.
Figure 5A:
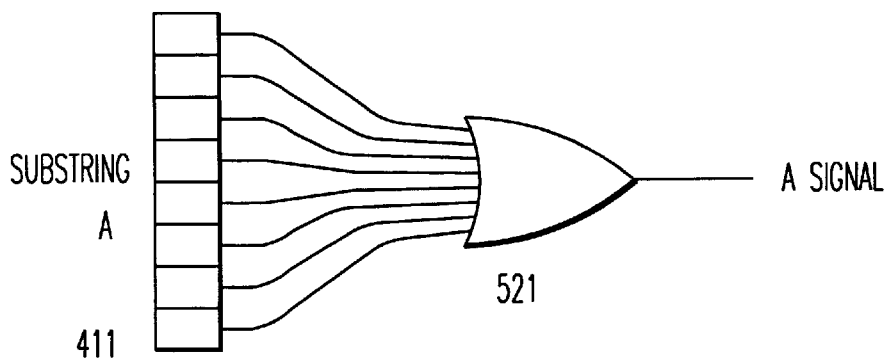
FIG. 5 shows a preferred embodiment of logic circuitry for generating A signal, B signal, C signal, and D signal for the preferred embodiment as shown in FIG. 4.
Figure 5B:
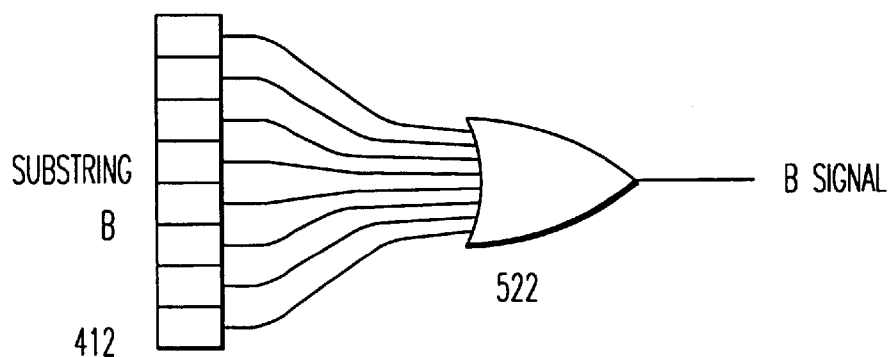
Figure 5C:
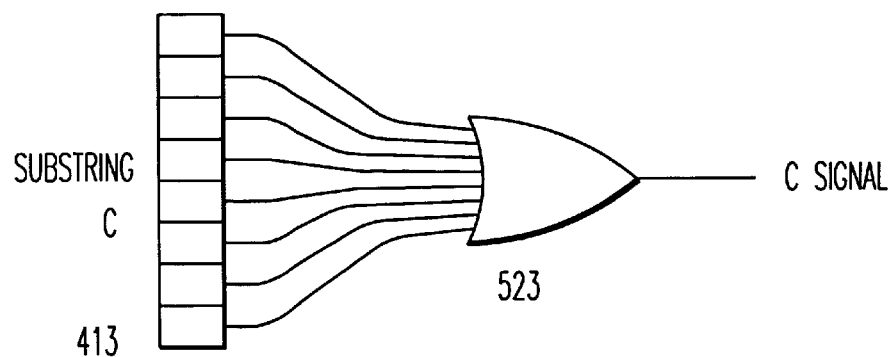
Figure 5D:
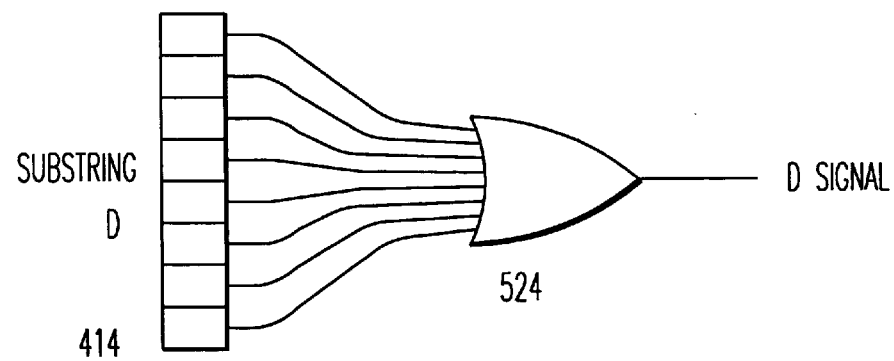

Another embodiment according to the present invention is illustrated in FIGS. 4–5. In this preferred embodiment, instead of using three levels as in the previous embodiment, a two-level breaking down of the same 32-bit bit-string is illustrated.

As shown in FIG. 4, a similar 32-bit bit-string 410 is used for illustrations. The first level divides the 32-bit bit-string into four first intermediate sub-strings: sub-string A 411, sub-string B 412, sub-string C 413, and sub-string D 414. Each of the four sub-strings 411,412,413,414 comprises 8 bits of data. Particularly, sub-string D 414 is the most significant sub-string; sub-string C 413 is the second most significant sub-string; sub-string B 412 is the second least significant sub-string; and sub-string A 411 is the least significant sub-string. As shown in the figure, eight 4-to-1 multiplexers 421,422 . . . 428 are used in the first level 491 instead of sixteen 2-to-1 multiplexers 121,122 . . . 136 used in the previous example. Specifically, each of the eight multiplexers 421,422 . . . 428 is responsible to select one data bit out of four data bits provided from the four intermediate sub-strings 411,412,413,414. As shown in the figure, two control signals S4,S3 are provided to each of the eight multiplexers 421,422 . . . 428 for controlling the selections of the eight multiplexers 421,422. . .428. The generation of the control signals is similar to the previous embodiment. That is, four ORed results (i.e. A signal, B signal, C signal, and D signal) are generated by ORing each of the 8 bits of the four sub-strings 411,412,413,414. As shown in FIG. 5, D signal is generated by ORing the eight bits in the D sub-string 414; C signal is generated by ORing the eight bits of the C sub-string 413; B signal is generated by ORing the eight bits of the B sub-string 412; and A signal is generated by ORing the eight bits of the A sub-string 411. After the four ORed results (i.e. A signal, B signal, C signal, and D signal) are generated, the two control signals S4 and S3 are generated using the truth table:

| S4 | S3 | D | C | B | A |
|----|----|----|----|----|----|
| 1  | 1  | 1 | x | x | x |
| 1  | 0  | 0 | 1 | x | x |
| 0  | 1  | 0 | 0 | 1 | x |
| 0  | 0  | 0 | 0 | 0 | x |

Thus, the two control signals S4,S3 are generated as follows:

$S4=D+\sim DC$ $S3=D+\sim D\sim CB$

After the eight 4-to-1 multiplexers 421,422 . . . 428 select the sub-string containing the most significant set bit, the selected sub-string is then kept in a 8 bit register 430 for the second level operation 492. As shown in the figure, these eight bits 431,432 . . . 438 are named as "h,g,f,e,d,c,b,a", where a 431 is the least significant bit and h 438 is the most significant bit. In this preferred embodiment, the final three control bits S2,S1,S0 are generated using these 8 bits 431,432 . . . 438. The truth table of the three control signals S2,S1,S0 is as follows:

| S2 | S1 | S0 | h | g | f | e | d | c | b | a |
|----|----|----|----|----|----|----|----|----|----|----|
| 1 | 1 | 1 | 1 | x | x | x | x | x | x | x |
| 1 | 1 | 0 | 0 | 1 | x | x | x | x | x | x |
| 1 | 0 | 1 | 0 | 0 | 1 | x | x | x | x | x |
| 1 | 0 | 0 | 0 | 0 | 0 | 1 | x | x | x | x |
| 0 | 1 | 1 | 0 | 0 | 0 | 0 | 1 | x | x | x |
| 0 | 1 | 0 | 0 | 0 | 0 | 0 | 0 | 1 | x | x |
| 0 | 0 | 1 | 0 | 0 | 0 | 0 | 0 | 0 | 1 | x |
| 0 | 0 | 0 | 0 | 0 | 0 | 0 | 0 | 0 | 0 | 1 |

Thus, the last three control signals can be generated as follows:

$S2=h+\sim hg+\sim h\sim gf+\sim h\sim g\sim fe$ $S1=h+\sim hg+\sim h\sim g\sim f\sim ed+\sim h\sim g\sim f\sim e\sim dc$ $S0=h+\sim h\sim gf+\sim h\sim g\sim f\sim ed+\sim h\sim g\sim f\sim e\sim d\sim cb$ By combining the above-calculated equations, the five control signals can be generated as follows:

$S4=D+\sim DC$ $S3=D+\sim D\sim CB$ $S2=h+\sim hg+\sim h\sim gf+\sim h\sim g\sim fe$ $S1=h+\sim hg+\sim h\sim g\sim f\sim ed+\sim h\sim g\sim f\sim e\sim dc$ $S0=h+\sim h\sim gf+\sim h\sim g\sim f\sim ed+\sim h\sim g\sim f\sim e\sim d\sim cb$ As discussed previously, the five index bits indicating the most significant set bit are the same as these five control signals S4,S3,S2,S1,S0.

In addition, this embodiment can be modified by one skilled in the art to locate the least significant set bit in a bit-string. The implementation of locating the least significant set bit in a bit-string is very similar to the implementation of locating the most significant set bit. The differences are in the equations in generating the five index bits [S4, S3,S2,S1,S0]. For example, in the preferred embodiment as shown in FIG. 1, the following equations can be used to locate the least significant set bit of a 32-bit bit string:

$S4=A+\sim AB$ $S3=A'+\sim A'B'$ $S2=A'+\sim A'\sim B'C'$ $S1=a+\sim ab$ $S0=a+\sim a\sim bc$ Another aspect of the present invention is to generate all the ORed signals (e.g. A signal, B signal, C signal, and D signal, etc) using AND gates, instead of using OR gates as discussed in the preceding paragraphs. For example, in the preferred embodiment as shown in FIGS. 1–3, each of the A signal, B signal, C signal, D signal, A' signal, B' signal, C' signal, D' signal is generated by ORing all bits of the corresponding sub-string. Furthermore, the five control signals in the embodiment as shown in FIGS. 1–3 are generated based on the assumption that each of the respective signals (i.e. A signal, B signal, C signal, D signal, A' signal, B' signal, C' signal, D' signal) is generated by ORing all bits in the corresponding sub-string.

Thus, to implement this aspect of the present invention, every bit of the original bit string is first inverted before being grouped into sub-strings. After every bit of the original bit string is inverted, the bit string is divided as groups similar to the embodiment as discussed above. For example, a similar structure of the system as shown in FIG. 1 can be employed.

In the first level, all bits of each sub-string are ANDed together to form the following signals: A signal, B signal, C signal, or D signal. After these four signals (i.e. A signal, B signal, C signal, and D signal) are generated, the control signal S4 is generated using the following truth table:

| S4 | D | C | B | A |
|----|----|----|----|----|
| 1 | 0 | x | x | x |
| 1 | 1 | 0 | x | x |
| 0 | 1 | 1 | 0 | x |
| 0 | 1 | 1 | 1 | 0 |

After solving the truth table, $S4=\sim D+D\sim C$

Furthermore, in this preferred embodiment, A' signal, B' signal, C' signal, and D' signal are generated by ANDing each of the four bits data in the second level of the system as shown in FIG. 1. Thus, the control signals S3,S2 can be generated using the following truth table:

| S3 | S2 | D' | C' | B' | A' |
|----|----|----|----|----|----|
| 1  | 1  | 0  | x  | x  | x  |
| 1  | 0  | 1  | 0  | x  | x  |
| 0  | 1  | 1  | 1  | 0  | x  |
| 0  | 0  | 1  | 1  | 1  | 0  |

After simplifying the truth table, the following equations are generated:

$$S3 = \sim D' + D' \sim C'$$

$$S2 = \sim D' + D'C' \sim B'$$

Finally, the control signals S1,S0 can be generated using the final four bits (i e. a,b,c,d) as shown in FIG. 1 according to the following truth table:

| S1 | S0 | d | c | b | a |
|----|----|---|---|---|---|
| 1  | 1  | 0 | x | x | x |
| 1  | 0  | 1 | 0 | x | x |
| 0  | 1  | 1 | 1 | 0 | x |
| 0  | 0  | 1 | 1 | 1 | 0 |

After simplifying the truth table, the following equations are generated:

$$S1 = d + d \sim c$$

$$S0 = \sim d + dc \sim b$$

Therefore, in this preferred embodiment when the original bit string is first bit inverted, the following equations can be used to locate the least significant set bit of a 32-bit bit string:

$$S4 = \sim D + D \sim C$$

$$S3 = \sim D' + D' \sim C'$$

$$S2 = \sim D' + D'C' \sim B'$$

$$S1 = \sim d + d \sim c$$

$$S0 = \sim d + dc \sim b$$

It should be pointed out again that each of control signals (i.e. A signal, B signal, C signal, D signal, A' signal, B' signal, C' signal, and D' signal) in this preferred embodiment is generated by ANDing all bits of the corresponding sub-string, instead of by ORing all bits of the corresponding sub-string as shown in the first two embodiments.

Furthermore, it should be noted that the present invention can be used in any number of data-bits in the bit-string. Preferably, the number of bits of the original data word should be $2^N$ with N is a positive integer. However, the present invention can also be adapted to handle any numbers of data bits in the original bit-string.

It is to be understood that while the invention has been described above in conjunction with preferred specific embodiments, the description and examples are intended to illustrate and not limit the scope of the invention, which is defined by the scope of the appended claims.

What is claimed is:

1. An apparatus for locating a most significant set bit in an original bit-string, wherein said original bit-string comprises a plurality of data bits, comprising:

at least one level of sub-string extractor for extracting a sub-string from an input bit-string, wherein said sub-string comprises said most significant set bit of said bit-string, wherein said sub-string of each one level of the sub-string extractor is provided as the input bit-string of the subsequent level when there is a subsequent level of sub-string extractor after the current level of the sub-string extractor, wherein said original bit-string is provided as the input bit-string for the first level of the sub-string extractor, each level of the sub-string extractor producing an index indicating the location of the corresponding sub-string extracted in the corresponding input bit-string provided; and a bit locator for generating a precise index indicating the location of said most significant bit in the sub-string generated by the last level of the sub-string extractor, wherein the location of said most significant set bit is provided by combining all index generated by said at least one level sub-string extractor and said precise index generated by said bit locator.

2. The apparatus according to claim 1, wherein each level of the sub-string extractor comprising:

at least one multiplexer for extracting the corresponding sub-string from the corresponding input bit-string; and a control signal generator coupled to the input bit-string of the corresponding level of the sub-string extractor for generating at least one control signal for each of the multiplexer in the same level for controlling the operation of the multiplexer.

3. The apparatus according to claim 2, wherein said control signal generator divides said input bit-string into a plurality of intermediate sub-strings.

4. The apparatus according to claim 3, wherein said control signal generator generates an OR result for each of the intermediate sub-strings by ORing all of the data bits in the corresponding intermediate sub-strings.

5. The apparatus according to claim 4, wherein said control signal generator determines which of the plurality of the intermediate sub-strings comprises said most significant set bit.

6. The apparatus according to claim 5, wherein said control signal generator generates the control signal by performing Boolean logic operations on the OR results generated for all the intermediate sub-strings.

7. The apparatus according to claim 3, wherein said control signal generator generates an AND result for each of the intermediate sub-strings by ANDing all of the data bits in the corresponding intermediate sub-strings.

8. The apparatus according to claim 7, wherein said control signal generator generates the control signal by performing Boolean logic operations on the AND results generated for all the intermediate sub-strings.

9. The apparatus according to claim 8, wherein said control signal generator determines which of the plurality of the intermediate sub-strings comprises said most significant set bit.

10. A method of searching a bit-string comprising a plurality of data bits for the first most significant set bit of said word, comprising the steps of:

(a) determining the number of data bits in said bit-string as a string number;

(b) if said string number is greater than a predetermined maximum number, (i) dividing said bit-string into a plurality of consecutive sub-strings;

(ii) determining which of the plurality of consecutive sub-string comprises the most significant set bit as a most significant sub-string; and (iii) going back to step (a) using said most significant sub-string as said bit-string; and (c) if said string number is equal or less than said predetermined maximum number, performing logic operations on said bit-string to determine the position of the most significant set bit in said bit-string.

11. An apparatus for locating a least significant set bit in an original bit-string, wherein said original bit-string comprises a plurality of data bits, comprising:

at least one level of sub-string extractor for extracting a sub-string from an input bit-string, wherein said sub-string comprises said least significant set bit of said bit-string, wherein said sub-string of each one level of the sub-string extractor is provided as the input bit-string of the subsequent level when there is a subsequent level of sub-string extractor after the current level of the sub-string extractor, wherein said original bit-string is provided as the input bit-string for the first level of the sub-string extractor, each level ofthe sub-string extractor producing an index indicating the location of the corresponding sub-string extracted in the corresponding input bit-string provided; and a bit locator for generating a precise index indicating the location of said least significant bit in the sub-string generated by the last level of the sub-string extractor, wherein the location of said least significant set bit is provided by combining all index generated by said at least one level sub-string extractor and said precise index generated by said bit locator.

12. The apparatus according to claim 11, wherein each level of the sub-string extractor comprising:

at least one multiplexer for extracting the corresponding sub-string from the corresponding input bit-string; and a control signal generator coupled to the input bit-string of the corresponding level of the sub-string extractor for generating at least one control signal for each of the multiplexer int the same level for controlling the operation of the multiplexer.

13. The apparatus according to claim 12, wherein said control signal generator divides said input bit-string into a plurality of intermediate sub-strings.

14. The apparatus according to claim 13, wherein said control signal generator generates an OR result for each of the intermediate sub-strings by ORing all of the data bits in the corresponding intermediate sub-strings.

15. The apparatus according to claim 14, wherein said control signal generator determines which of the plurality of the intermediate sub-strings comprises said least significant set bit.

16. The apparatus according to claim 15, wherein said control signal generator generates the control signal by performing Boolean logic operations on the OR results generated for all the intermediate sub-strings.

17. The apparatus according to claim 13, wherein said control signal generator generates an AND result for each of the intermediate sub-strings by ANDing all of the data bits in the corresponding intermediate sub-strings.

18. The apparatus according to claim 17, wherein said control signal generator generates the control signal by performing Boolean logic operations on the AND results generated for all the intermediate sub-strings.

19. The apparatus according to claim 18, wherein said control signal generator determines which of the plurality of the intermediate sub-strings comprises said least significant set bit.

20. A method of searching a bit-string comprising a plurality of data bits for the first least significant set bit of said word, comprising the steps of:

(a) determining the number of data bits in said bit-string as a string number;

(b) if said string number is greater than a predetermined maximum number, (i) dividing said bit-string into a plurality of consecutive sub-strings;

(ii) determining which of the plurality of consecutive sub-string comprises the least significant set bit as a least significant sub-string; and (iii) going back to step (a) using said least significant sub-string as said bit-string; and (c) if said string number is equal or less than said predetermined maximum number, performing logic operations on said bit-string to determine the position of the least significant set bit in said bit-string.

21. An apparatus for locating a most significant set bit in an original bit-string, wherein said original bit-string comprises a plurality of data bits, comprising:

a recursive mechanism for recursively breaking down said original bit-string into a plurality of sub-strings and selecting an intermediate sub-string from said plurality of sub-strings, wherein said intermediate sub-string comprises said most significant set bit; and logic circuitry coupled to said recursive mechanism for determining the exact position of said most significant set bit in said original bit-string.

22. An apparatus for locating a least significant set bit in an original bit-string, wherein said original bit-string comprises a plurality of data bits, comprising:

a recursive mechanism for recursively breaking down said original bit-string into a plurality of sub-strings and selecting an intermediate sub-string from said plurality of sub-strings, wherein said intermediate sub-string comprises said least significant set bit; and logic circuitry coupled to said recursive mechanism for determining the exact position of said least significant set bit in said original bit-string.

* * * * *